United States Patent
Alberth et al.

(10) Patent No.: US 9,014,245 B2
(45) Date of Patent: *Apr. 21, 2015

(54) METHOD AND APPARATUS FOR COMPENSATING FOR PHASE SHIFT IN A COMMUNICATION DEVICE

(75) Inventors: William P. Alberth, Prairie Grove, IL (US); Gregory R. Black, Vernon Hills, IL (US); Armin W. Klomsdorf, Chicago, IL (US)

(73) Assignee: Google Technology Holdings LLC, Mountain View, CA (US)

( * ) Notice: Subject to any disclaimer, the term of this patent is extended or adjusted under 35 U.S.C. 154(b) by 300 days.

This patent is subject to a terminal disclaimer.

(21) Appl. No.: 13/429,886

(22) Filed: Mar. 26, 2012

(65) Prior Publication Data

US 2013/0251010 A1 Sep. 26, 2013

(51) Int. Cl.
*H04B 1/38* (2006.01)
*H03H 7/40* (2006.01)
*H04B 1/04* (2006.01)
*H03H 7/20* (2006.01)

(52) U.S. Cl.
CPC . *H03H 7/40* (2013.01); *H03H 7/20* (2013.01); *H04B 1/0458* (2013.01)

(58) Field of Classification Search
USPC ............... 375/219, 222, 354, 316, 295, 259; 333/124
See application file for complete search history.

(56) References Cited

U.S. PATENT DOCUMENTS

| | | | |
|---|---|---|---|
| 7,486,941 B2 | 2/2009 | Rahman et al. |
| 7,973,725 B2 | 7/2011 | Qi et al. |
| 8,068,798 B2 | 11/2011 | Wilcox et al. |
| 8,285,224 B2 | 10/2012 | Kondo et al. |
| 8,310,401 B2 | 11/2012 | Qi et al. |
| 8,320,850 B1 | 11/2012 | Khlat |
| 8,462,057 B2 | 6/2013 | Qi et al. |
| 8,503,689 B2 | 8/2013 | Schreuder et al. |

(Continued)

FOREIGN PATENT DOCUMENTS

| | | |
|---|---|---|
| EP | 1298810 A2 | 4/2003 |
| JP | 2003-318689 A | 11/2003 |

(Continued)

OTHER PUBLICATIONS

Patent Cooperation Treaty, International Search Report and Written Opinion of the International Searching Authority for International Application No. PCT/US2013/031143, Aug. 1, 2013, 10 pages.

(Continued)

*Primary Examiner* — Vineeta Panwalkar
(74) *Attorney, Agent, or Firm* — Leydig, Voit & Mayer, Ltd.

(57) ABSTRACT

A method and apparatus for compensating is described, in which a tuning network is electrically coupled to an antenna and to a phase shift network. A controller communicatively linked to the tuning network and to the phase shift network receives data regarding the state of a communication system. The controller changes the impedance of the tuning network, and changes the phase shift of the phase shift network based on the received data. The received data may include information regarding the channel, band, or sub-band on which a communication device is communicating; information regarding on the application state of the device; and the modem state of the device.

18 Claims, 10 Drawing Sheets

(56) References Cited

U.S. PATENT DOCUMENTS

| | | |
|---|---|---|
| 8,599,077 B2 | 12/2013 | Qi et al. |
| 8,706,053 B2 | 4/2014 | Camp, Jr. et al. |
| 2002/0114444 A1* | 8/2002 | Anderson et al. ............. 379/398 |
| 2004/0127178 A1 | 7/2004 | Kuffner |
| 2005/0245204 A1* | 11/2005 | Vance .............................. 455/80 |
| 2007/0142014 A1 | 6/2007 | Wilcox |
| 2008/0280570 A1 | 11/2008 | Blin |
| 2010/0073103 A1 | 3/2010 | Spears et al. |
| 2010/0127945 A1 | 5/2010 | Rousu et al. |
| 2010/0197261 A1* | 8/2010 | Zibrik et al. ............... 455/232.1 |
| 2010/0273441 A1 | 10/2010 | Dubash et al. |
| 2012/0063368 A1 | 3/2012 | Boyle |
| 2012/0300870 A1 | 11/2012 | Dickey |
| 2013/0069737 A1* | 3/2013 | See et al. ......................... 333/32 |
| 2013/0251010 A1 | 9/2013 | Alberth et al. |
| 2013/0315285 A1 | 11/2013 | Black et al. |

FOREIGN PATENT DOCUMENTS

| | | |
|---|---|---|
| WO | 2006107841 A2 | 10/2006 |
| WO | WO 2011/148225 A1 | 12/2011 |

OTHER PUBLICATIONS

International Bureau of WIPO, International Preliminary Report on Patentability for International Application No. PCT/US2013/031143 (Oct. 9, 2014).

Patent Cooperation Treaty, International Search Report of the International Searching Authority for International Application No. PCT/US2013/040237 Jul. 9, 2013.

Patent Cooperation Treaty, International Search Report and Written Opinion of the International Searching Authority for International Application No. PCT/US2013/051922 Oct. 30, 2013.

* cited by examiner

| FIG. 9A |
| FIG. 9B |

METHOD AND APPARATUS FOR COMPENSATING FOR PHASE SHIFT IN A COMMUNICATION DEVICE

TECHNICAL FIELD

The present invention relates generally to antenna tuning and, more particularly, to compensating for phase shifts that result from antenna tuning.

CROSS REFERENCE TO RELATED APPLICATIONS

The present application is related to U.S. patent application Ser. No. 13/478,811, filed on May 23, 2012, to Black, et al.

BACKGROUND

As mobile communication has become increasingly sophisticated, antenna tuning techniques have become more advanced. Antenna tuning involves matching the impedance of the load of the components connected to an antenna to the impedance of the antenna itself. The antFenna impedance may be affected by a variety of factors, including the position of the mobile communication device (e.g. cellphone) with respect to the user's body and the state of the communication system. When the impedance of the antenna changes, it is desirable to tune the antenna (e.g. by changing the impedance of the load) in order to keep the impedances as closely matched as possible. However, when the impedance of the load changes, the phase of the signals travelling to and from the antenna also tends to change. Unfortunately, phase changes in mobile communication signals are interpreted as meaningful data which can degrade the reception of the signal, and lead to garbled transmissions. There are certain scenarios in which impedance changes and the associated phase changes can be anticipated and tolerated by the communication system. One example is when the channel being used for communication changes. During a channel change, the transmit and receive modems generally perform a channel estimate which is used to set up the use of the channel by the mobile device. Should the phase change occur before the channel estimate, or while the transmitter is not emitting a signal then the phase change will have no affect on the received signal at the base station. Subsequent insertion phase changes of the channel such as those due receiver mobility and multipath channel fading are also tolerated by the receiver. However, when other more abrupt changes in impedance occur during the transmission of data such as from antenna impedance tuning, it is much more difficult for the base station receiver to react to the resulting phase shift and the quality of the received signal could be degraded.

BRIEF DESCRIPTION OF THE DRAWINGS

Various embodiments of the present invention will be described below in more detail, with reference to the accompanying drawings.

It is to be noted, however, that the appended drawings illustrate embodiments of this invention and are therefore not to be considered limiting of its scope, for the invention may admit to other equally effective embodiments.

DETAILED DESCRIPTION

In accordance with the foregoing, a method and apparatus for compensating for a phase shift is disclosed herein. In an embodiment of the invention, a communication device operating in a communication network includes a tuning network electrically coupled to its antenna, a phase shift network electrically coupled to the tuning network, and a controller communicatively linked to both the tuning network and to the phase shift network. The controller receives data regarding the state of a communication system. The controller changes the impedance of the tuning network and changes the phase shift of the phase shift network based on the received data. The data may include information regarding the channel, band, or sub-band on which the communication device is communicating; information regarding the application for which the communication device is being used; and the state of a receive and/or transmit modem of the device.

In another embodiment of the invention, a method for compensating for a phase shift involves receiving data regarding the band, sub-band or channel over which a communication device is communicating, the state of a modem being used by the communication device to transmit or receive, and the application for which the communication device is being used (e.g., voice application, left-hand, right-hand, or data). The impedance of a matching network and the phase shift of a phase shift network are adjusted based on this data.

Figure 1:
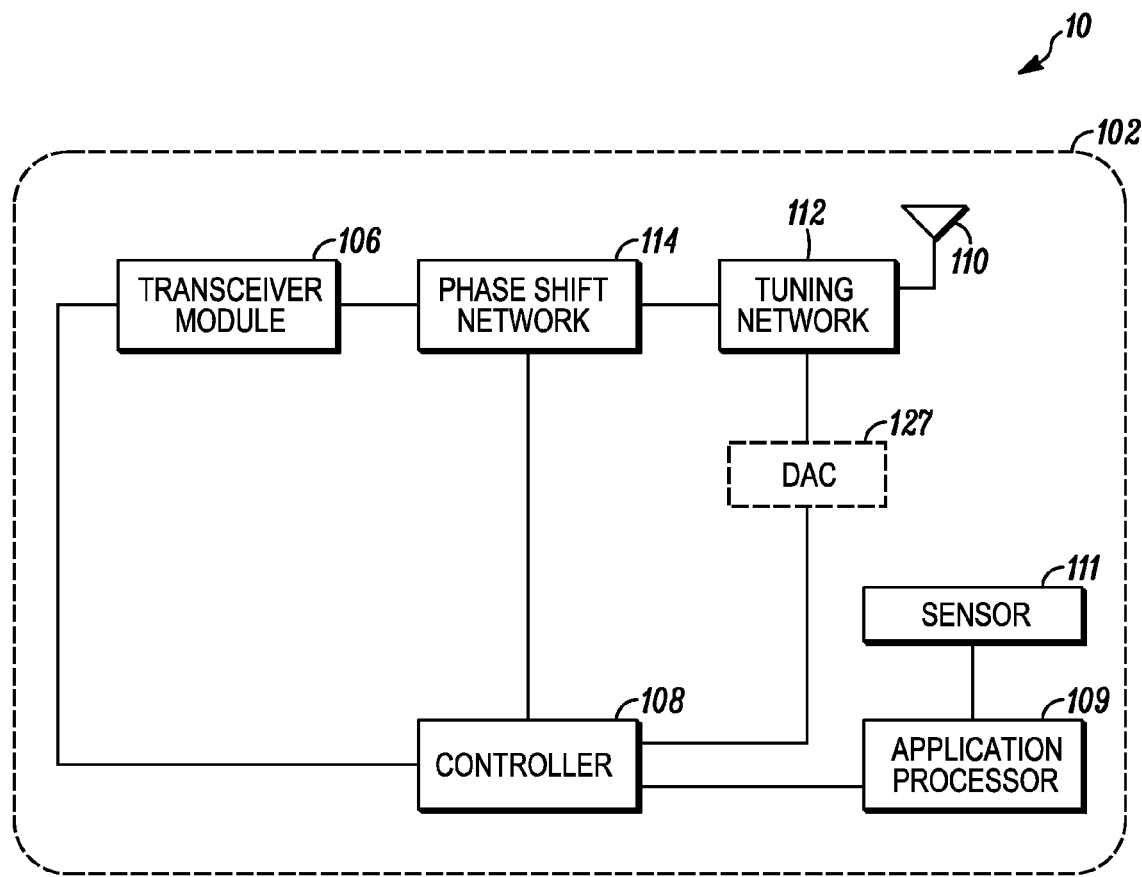
FIG. 1 is an example of a communication system in which the invention may be implemented.
Figure 1:
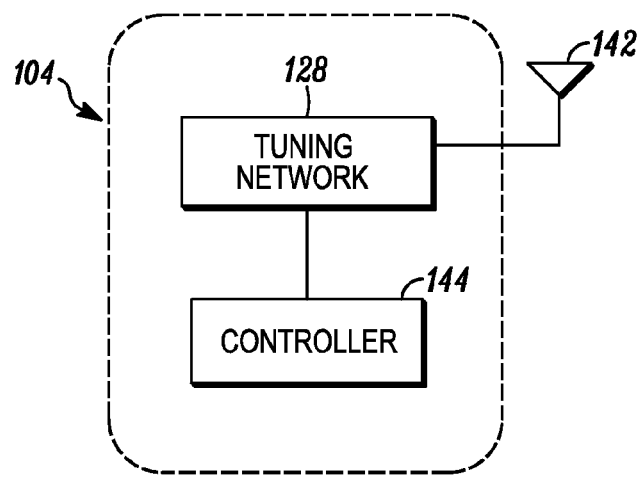

An example of a communication system in which the invention may be implemented will now be described. Referring to FIG. 1, the communication system, generally labeled 10, includes a mobile device 102 and a base station 104. The mobile device 102 may be any of a variety of devices, including a cell phone (smartphone or otherwise), a dongle, a notebook computer, or tablet computer. Similarly, the base station 104 may be any of a variety of devices, including a base station of a cellular network, a wireless access point, or a mobile device acting as a wireless access point. In one embodiment, the mobile device 102 is a 4G Long-Term Evolution (LTE) phone and the base station 104 is a base station of a 4G LTE network. The mobile device 102 includes an antenna 110, a variable tuning network 112 electrically coupled to the antenna 110, a tunable phase shift network 114 electrically coupled to the tuning network, and a transceiver module 106 electrically coupled to the phase shift network 114. Although these components are depicted as being next to one another, it is understood that there may be many intervening components that will still permit the components of FIG. 1 to be electrically coupled such that electrical signals from one component will reach the other component.

The mobile device 102 also includes a controller 108 communicatively linked to the transceiver module 106, the phase shift network 114 and the tuning network 112. The mobile device 102 further includes an application processor 109 communicatively linked to the controller 108 as well as to other components of the mobile device 102, such as to a sensor 111 (e.g., a proximity sensor) that detects the physical position of the mobile device 102. The impedance of the tuning network 112 can be varied to match the impedance of the antenna 110. In one embodiment, the default impedance of the transceiver 106 is 50 ohms, and the impedance of the antenna is a complex impedance other than 50 Ohms. To carry out tuning in one embodiment, the input impedance of the tuning network 112 is set to 50 Ohms and the output impedance of the tuning network is set to the complex conjugate of the antenna impedance, which is the impedance needed to maximize the transfer of power into and out of the antenna 110. Thus, the tuning network 112 transforms the antenna impedance to 50 Ohms, thereby 'matching' the impedance of transceiver 106 and the antenna 110. As will be discussed below in more detail, the phase shift network 114 compensates for changes in phase that can occur due to changes in the tuning network 112.

The transceiver module 106 converts digital signals into analog signals and vice-versa to facilitate the transmission and receipt of communication by the mobile device 102. The application processor 109 executes application programs to control various functions of the mobile device 102, such as displaying pictures and text on a display, facilitating voice calls, setting up data connections, etc. The controller 108 controls the operation of the transceiver module 106, the phase shift network 114 and the tuning network 112.

The base station 104 includes a transceiver module 128 and a controller 144 communicatively linked to the transceiver module 128. The base station further includes an antenna 142, which is electrically coupled to the transceiver module 128. The transceiver module 128 converts digital signals into analog signals and vice-versa to facilitate the transmission and receipt of communication by the base station 104. The controller 144 controls the operation of the transceiver module 128.

Referring still to FIG. 1, a basic description of how data moves back and forth between the mobile device 102 and the base station 104 in an embodiment of the invention will now be described. It is understood that this is a high-level description and that there may be many other steps involved in the communication. The transceiver 106 formats the data into a well-known message format, and converts the digital signals into radio frequency (RF) signals. The RF signals are passed to the phase shift network 114 which may advance or retreat the phase of the signal by a known amount. The phase shifted RF signal passes to the tuning network 112. The tuning network 112 is operable to adjust the match to the antenna 110 to optimize the ability of the antenna 110 to radiate a signal that can be received by the base station 104. The signal then passes to the antenna 110 which transmits the signal to the base station antenna 142. The received signal passes to the transceiver module 128 which demodulates and recovers the original data, which then is passed to the controller 144. The controller 108 controls the tuning network 112 and the phase shift network 114. If the controller 108 adjusts the tuning network 112 while a signal is being transmitted by the mobile device 102, the controller 108 determines the phase shift, P, that will result from the tuning network adjustment. The controller 108 will then determine the required control signals to send to the phase shift network 114 to change its phase by an amount −P. Thus, with a signal passing through the phase shift network 114 with a phase −P and the tuning network 112 having a phase shift P, the net phase shift of the transmitted signal will be −P+P=0, thereby shielding the base station 104 from a phase shift that could adversely affect the received signal quality.

Furthermore, the signal takes a fixed and known time to propagate between the phase shift network 114 and the tuning network 112. The controller 108 can adjust the settings of the phase shift network 114 at a time T, and then wait to adjust the tuning network 112 for a time delay D, where the time delay equals the propagation delay from the phase shift network 114 to the tuning network 112. In this way the resulting transmitted signal will show minimal phase shift from the tuning network adjustment event.

It is also possible to operate the antenna tuning network 112 first at a time T2, and then adjust the phase shift network after a time delay D where D is the propagation time between the antenna tuner and the phase shift network. In this way the resulting receive signal will show minimal phase shift from the tuning network adjustment event.

Figure 2:
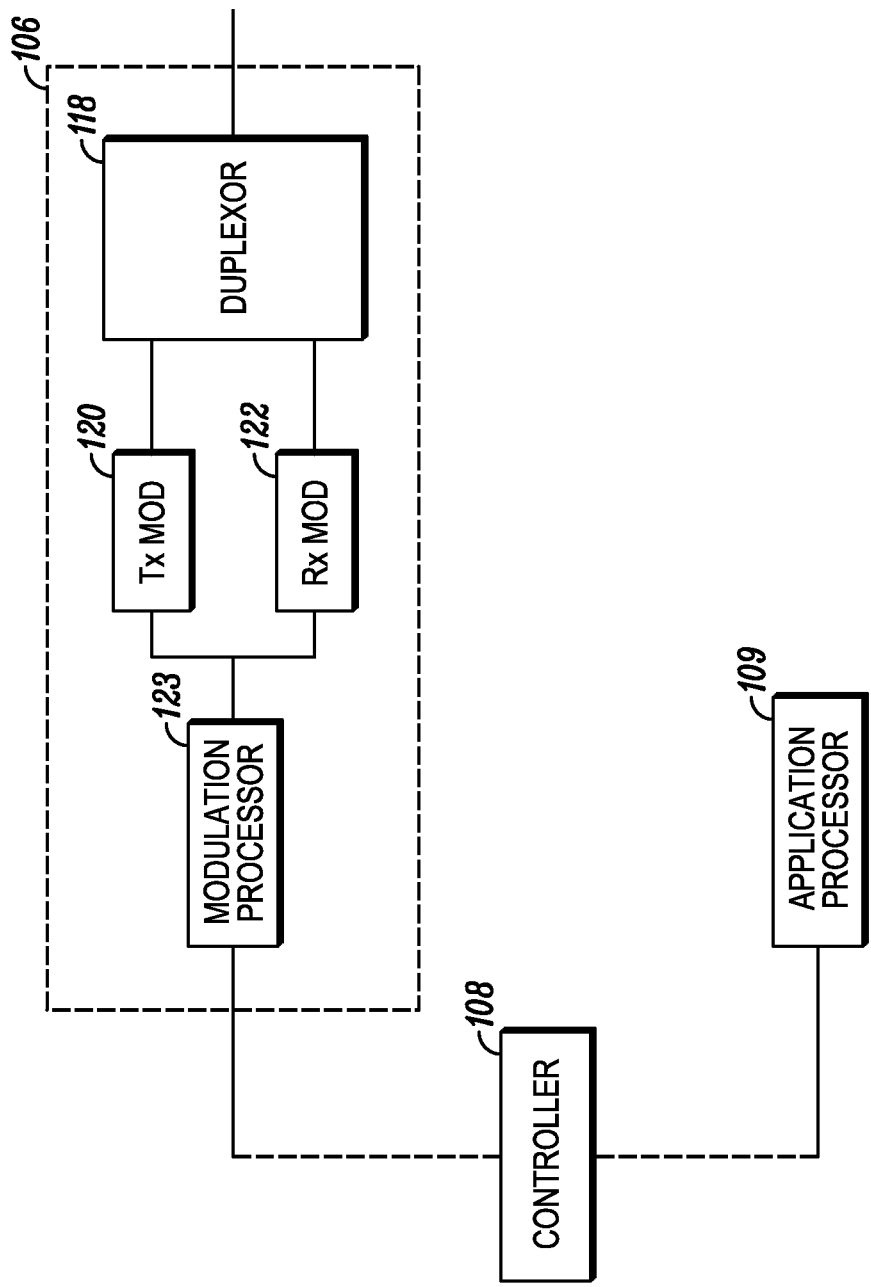
FIG. 2 shows components of a mobile device according to an embodiment of the invention.

Referring to FIG. 2, a more detailed description of the architecture of the transceiver module 106 (from FIG. 1) according to an embodiment of the invention will now be described. The transceiver module 106 includes a duplexor 118, a transmission (Tx) modem 120 communicatively linked to the duplexor 118, and a receiver (Rx) modem 122 also communicatively linked to the duplexor 118 and a modulation processor 123 communicatively linked to both the Tx modem 120 and the Rx modem 122. The duplexor 118 combines and separates the signals coming from and going to the Rx modem 122 and the Tx modem respectively, enabling the mobile device 102 to both transmit and receive simultaneously. The modulation processor 123 also controls the band, sub-band or channel on which the Tx modem 120 and the Rx modem 122 communicate. The modulation processor 123 is communicatively linked to the controller 108. The modulation processor 123 sends data to the Tx modem 120, which converts the data into an analog format for transmission via the antenna 110. Conversely, the Rx modem 122 converts signals received via the antenna 110 into digital information for processing by the modulation processor 123. Upon processing the digital information, the modulation processor 123 transmits the digital information to the controller 108. The modulation processor 123 sends data regarding the band, sub-band, or channel on which the mobile device 102 is communicating to the controller 108 as well as data regarding the state of the Tx modem 120 and the Rx modem 122. The application processor 109 sends information regarding the application state to the controller 108.

Figure 3:
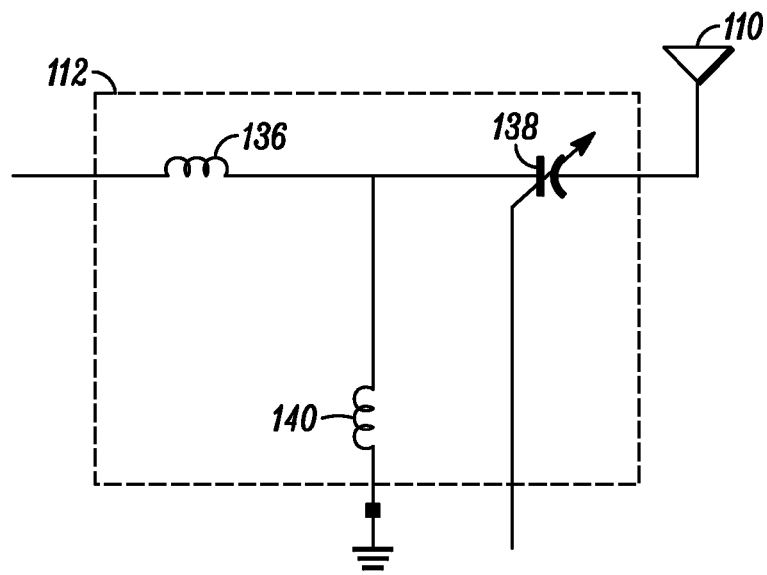
FIG. 3 shows a circuit layout of a variable tuning network according to an embodiment of the invention.

Referring to FIG. 3, a circuit implementation of the tuning network 112 according to an embodiment of the invention will now be described. The tuning network 112 provides a complex conjugate match between the impedance of the transceiver module 106, typically 50 Ohms, and the complex impedance of the antenna 110. Different antenna designs can be employed, each having particular tuning requirements. In an embodiment, a planar inverted 'L' antenna (PILA) is employed. In this embodiment, the tuning network 112 includes a circuit that has a first inductive element 136, a variable capacitive element 138 electrically coupled to the first inductive element 136, and a second inductive element 140 electrically coupled to the first inductive element 136 and the variable capacitive element 138 as well as to ground. The antenna 110 is electrically coupled to each of the aforementioned elements of tuning network 112. The variable capacitive element 138 may be implemented in a variety of ways, including a switched bank of capacitors or a capacitor with variable dielectric such as barium strontium titanate (BST) or a varactor diode.

Figure 4:
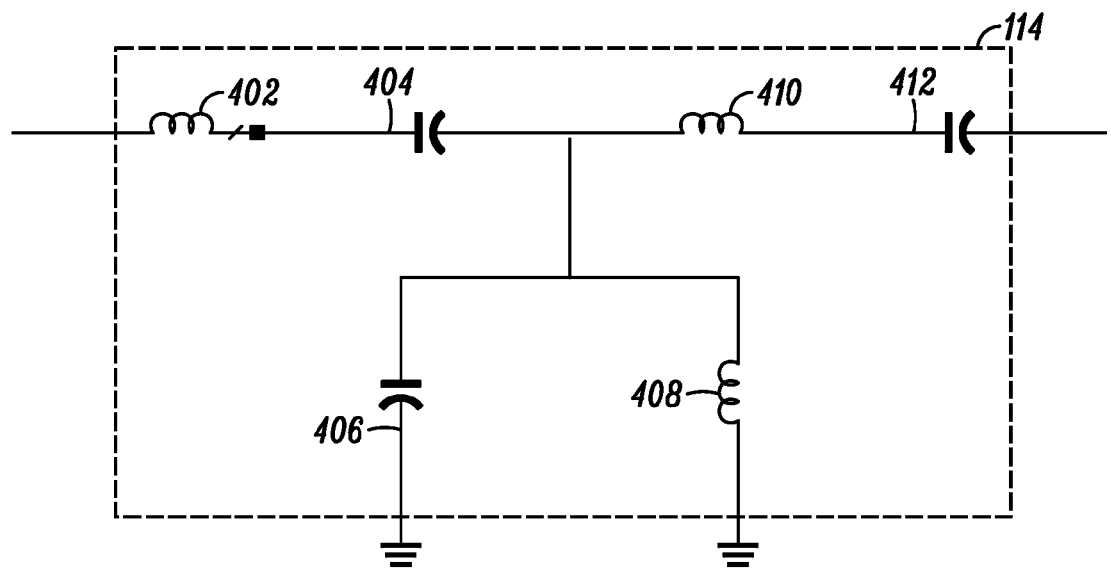
FIG. 4 shows a circuit layout of a tunable phase shift network according to an embodiment of the invention.

The phase shift network 114 (FIG. 1) can be implemented in a variety of ways. In an embodiment, tunable lumped element filters can be employed in high pass or low pass configurations of lumped elements, wherein the operating frequency is above the high pass corner frequency, or below the low pass corner frequency. In this way the phase can be adjusted without significantly changing the amplitude. In some cases, high pass and low pass configurations will result in a phase control range that is insufficient over a large operating frequency range. In applications requiring large operating frequency ranges, a high-pass/low-pass configuration can be employed. Referring to FIG. 4, a circuit implementation of the phase shift network 114 according to a high-pass/low-pass embodiment of the invention will now be described. In this embodiment, a high pass response is provided for low band operating frequencies in the range of 700 to 1000 MHz, and a low pass response is provided for high band operating frequencies in the range of 1700 to 2200 MHz. In this way a useful degree of phase control range can be provided, such as ninety degrees, at each operating frequency. In this embodiment the phase shift network 114 comprises a first inductor 402 and a first capacitor 404 which may be tunable, electrically coupled in series. The first inductor 402 and first capacitor 404 are electrically coupled to a second inductor 406 and to a second capacitor 408, which may be tunable. The second capacitor 408 is connected in shunt to ground. The second inductor 406 and the second capacitor 408 are electrically coupled to a third inductor 410 and a third capacitor 412, which may be tunable. The third inductor and third capacitor are electrically coupled in series. The transceiver 106 is electrically coupled to the first inductor 402 and to the first capacitor 404. The tuning network 112 is electrically coupled to the third inductor 410 and the third capacitor 412, which are electrically coupled in series. The variable capacitive elements 404, 408 and 412 may be implemented in a variety of ways, including a switched bank of capacitors or a capacitor with variable dielectric such as barium strontium titanate (BST) or a varactor diode. In some embodiments only series capacitors 404 and 412 are tunable. In other embodiments only shunt capacitor 408 is tunable.

The phase shift network 114 (FIG. 1) is controlled to cancel phase shifts occurring as a result of changes made to the tuning network 112. The phase shift can be calculated by analyzing the combined transfer function of the tuning network 112 and the antenna 110. To calculate the transfer function, an equivalent circuit of antenna 110 is generated to match the measured impedance and to provide an analog of measured efficiency of the antenna 110. Antenna impedance and radiation efficiency can vary depending on user positions, such as free-space and hand-held positions, or talking positions in close proximity to the user's head. Different equivalent circuits of antenna 110 can be generated to match the impedance and radiated efficiency of the antenna in different user positions.

Figure 5:
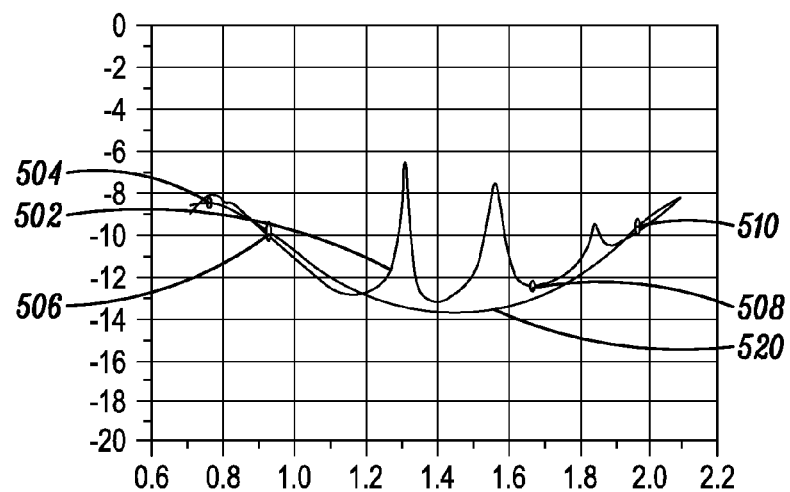
FIG. 5 shows data regarding a planar inverted L (PILA) embodiment of the antenna 110 of FIG. 1.
Figure 5:
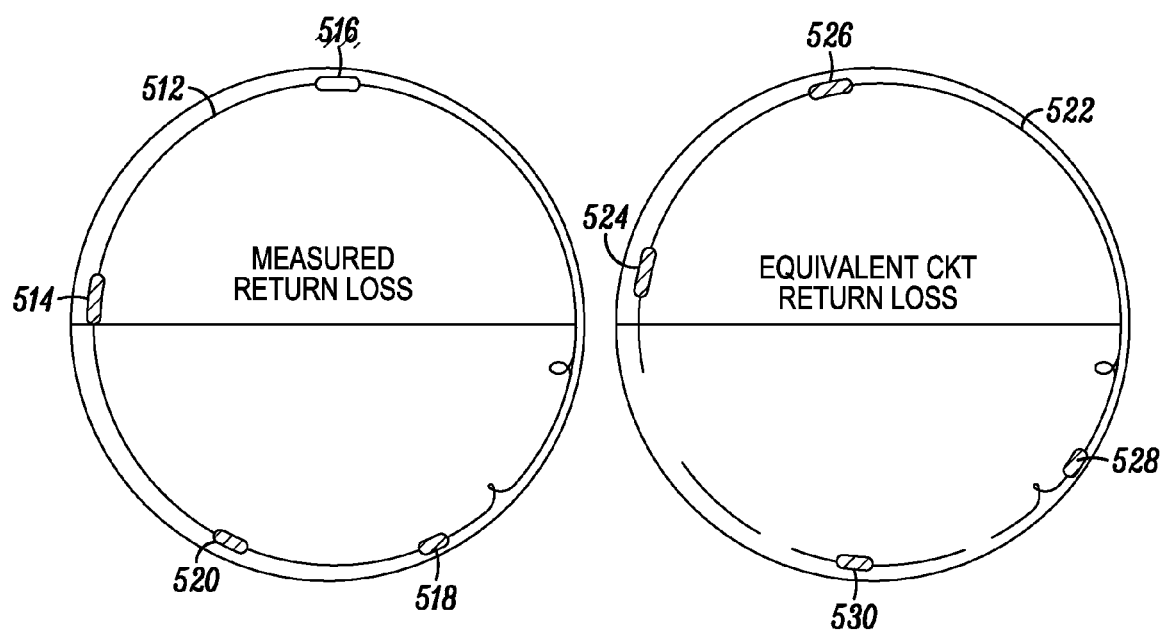

Referring to FIG. 5, antenna data 500 is shown for a planar inverted "L" (PILA) embodiment of antenna 110. Curve 502 is the delivered power magnitude in dB units of a PILA embodiment of the antenna 110 measured in free space. Curve segments shown in bold highlight the bands of interest on the delivered power curve 502. Curve segment 504 is the delivered power in a first band of interest from 745 to 760 MHz. Curve segment 506 is the delivered power in a second band of interest from 900 to 915 MHz. Curve segment 508 is the delivered power in a third band of interest from 1710 to 1725 MHz. Curve segment 510 is the delivered power in a fourth band of interest from 1965 to 1980 MHz. Curve 512 is the PILA antenna return loss measured in free space, plotted on a Smith chart. Return loss, $\Gamma$, is related to input impedance by the relationship, $\Gamma = (Z_{ANT} - Z_{SOURCE})/(Z_{ANT} + Z_{SOURCE})$, where $Z_{ANT}$ is the impedance of the antenna 110 and $Z_{SOURCE}$ is the output impedance of the transceiver module 106, typically 50 Ohms. Curve segment 514 is the return loss in a first band of interest from 745 to 760 MHz. Curve segment 516 is the return loss in the second band of interest from 900 to 915 MHz. Curve segment 518 is the return loss in the third band of interest from 1710 to 1725 MHz. Curve segment 520 is the return loss in the fourth band of interest from 1965 to 1980 MHz.

Figure 6:
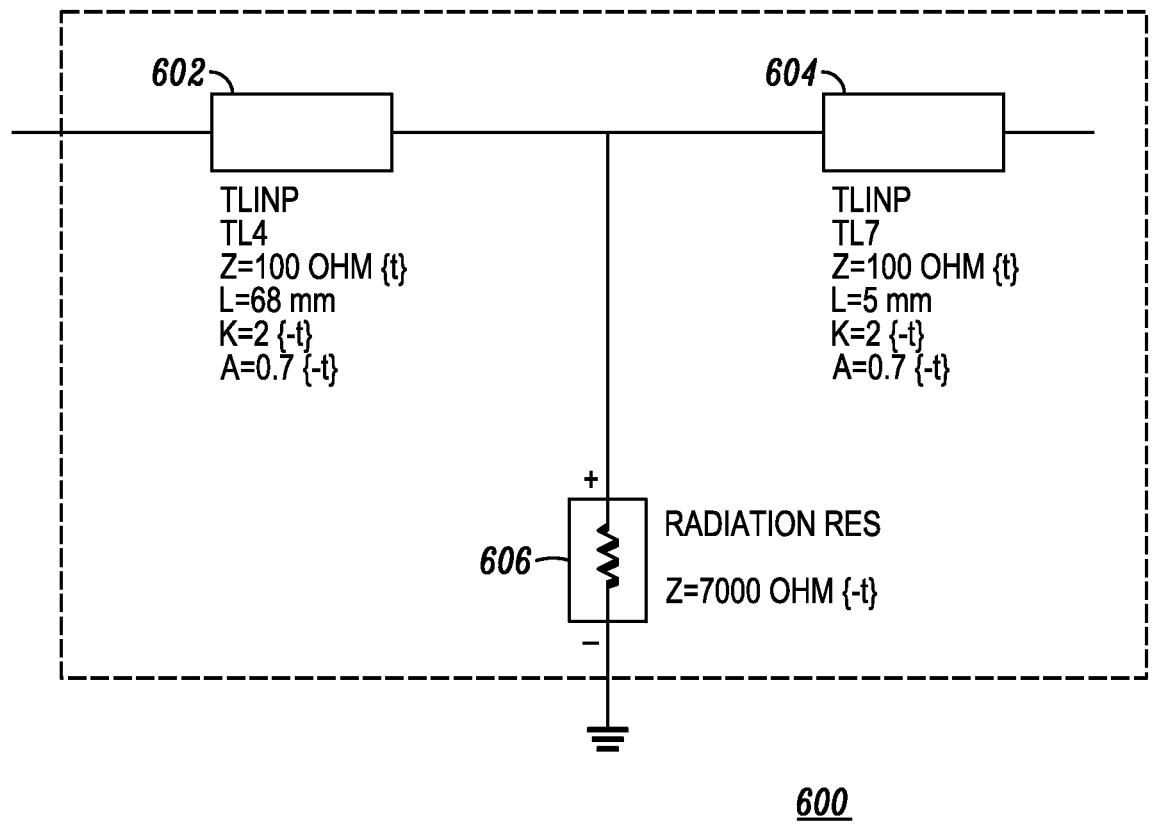
FIG. 6 shows an approximate equivalent circuit of the PILA embodiment of FIG. 5.

Referring now to FIG. 6, an approximate equivalent circuit 600 of the PILA embodiment of the antenna 110 is shown. The equivalent circuit is used to approximate the phase shift of the antenna 110 and the tuning network 112 caused by changes in the tuning network 112. The phase shift is the phase of the transfer function from the output of the transceiver module 106 to the radiated signal. In the equivalent circuit, the power dissipated in a radiation resistor serves as an analog of the radiated signal power. The equivalent circuit 600 comprises a first transmission line 602, a second transmission line 604, and a radiation resistor 606. Circuit parameters, such as the value of the radiation resistor 606, and the transmission line 602 and 604 parameters, are adjusted to match the measured impedance data based on the curve segments 502 and 504 in the frequency bands of operation and a measured radiation efficiency of the PILA antenna of approximately 60%.

Referring again to FIG. 5, curve 520 shows the delivered power magnitude in dB units of the equivalent circuit of FIG. 4, where the circuit parameters are selected to match the measured delivered curve segments for the four bands of interest shown in bold on delivered power curve 320. Curve 322 is the return loss of the equivalent circuit of FIG. 4 plotted on a Smith chart. Curve segment 324 is the return loss in a first band of interest from 745 to 760 MHz. Curve segment 326 is the return loss in the second band of interest from 900 to 915 MHz. Curve segment 328 is the return loss in the third band of interest from 1710 to 1725 MHz. Curve segment 330 is the return loss in the fourth band of interest from 1965 to 1980 MHz.

The equivalent circuit 600 (FIG. 6) can be analyzed to generate electrical data matching the measured electrical data of the PILA embodiment of the antenna 110 (FIG. 1) measured in free space, and similar equivalent circuits can be generated to match the electrical data of the antenna 110 measured in other user conditions, such as in mobile phone 'talking positions', in which the user's hand and head are proximate to the antenna near-field, and affect the measured impedance and efficiency.

Generally, antenna impedance is affected by the user's position. If the tuning circuit 112 (FIG. 1) is designed to optimally match the impedance of the antenna 110 in a first user position, it may not optimally match the impedance of the antenna 110 in a different user position. Thus the tuning circuit 112 can be adjusted to provide optimal matching designs for each user position. The phase shift that occurs when the tuning network 112 is changed is approximated by calculating the insertion phase through the tuning network 112 and the first transmission line 602 (FIG. 6) to the radiation resistor 606. For example, the tuning network 112 may be changed from a first state for interfacing to the antenna 110 in a free space position to a second state for interfacing to the antenna 110 in a right hand talking position. For each position, an optimum matching circuit is created by varying the tunable capacitor 138 in the tuning network 112.

Figure 7:
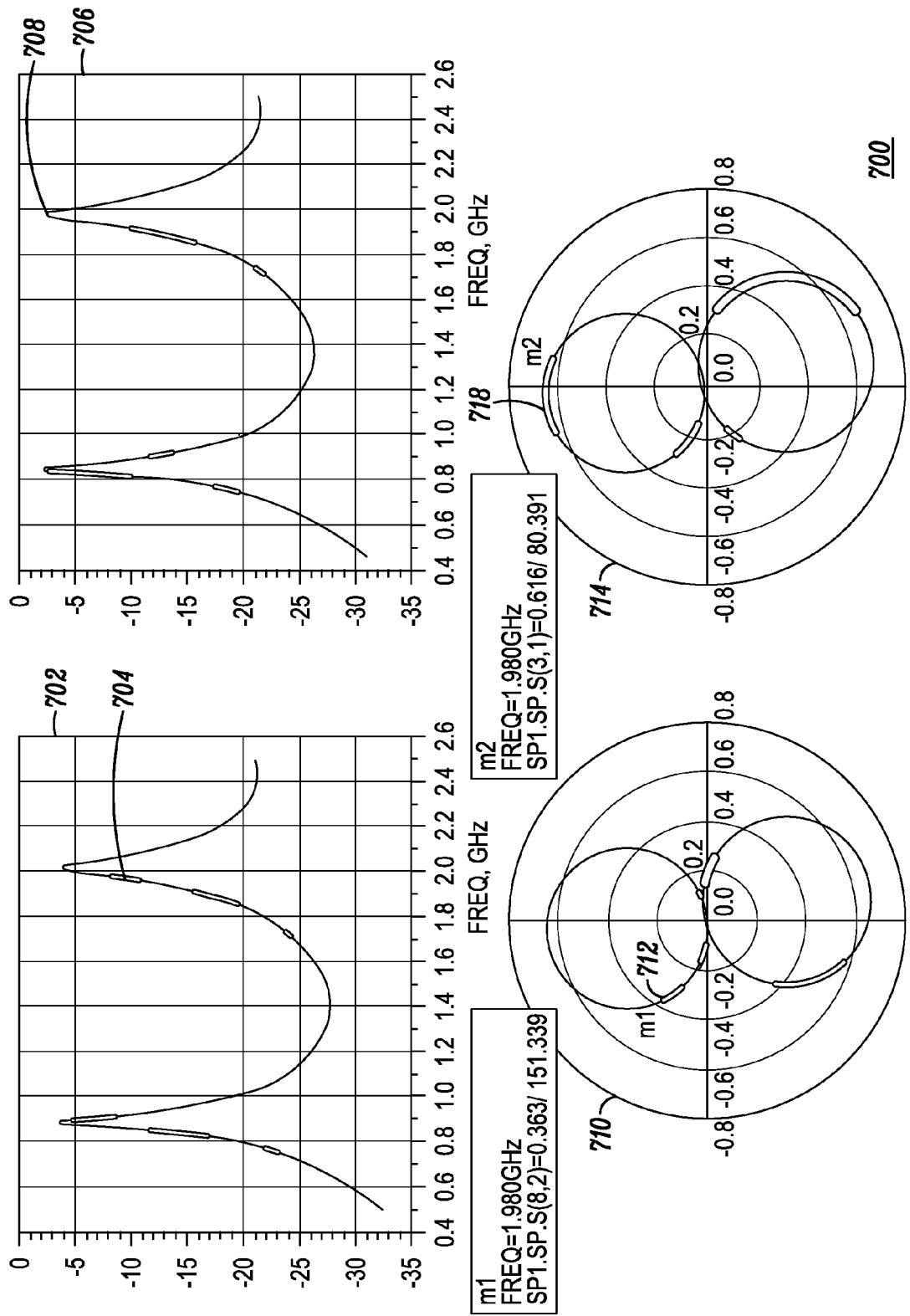
FIG. 7 shows simulation data that includes plots of transfer functions of the tuning network driving the antenna equivalent circuit of FIG. 6.

Referring to FIG. 7, simulation data 700 is shown which includes plots of transfer functions of the tuning network 112 (FIG. 1) driving the antenna equivalent circuit 600 (FIG. 6). In this particular simulation, the equivalent circuit 600 circuit parameters are adjusted for approximating the antenna 110 performance in a 'talking' user position, and design cases for the tuning network 112 are presented. In the first design case, the tuning network 112 is designed to maximize power transfer to a antenna 110 in a free space position in the fourth band of interest, from 1965 to 1980 MHz. In the second state, the tuning network 112 is designed to maximize power transfer to the antenna 110 in a user talking position in the fourth band of interest.

Referring again to FIG. 7, simulation data 700 is used to determine the change in insertion phase of the tuning network 112 (FIG. 1) driving the antenna equivalent circuit 600 (FIG. 6). Graph 702 shows the amplitude response from tuning network 112 designed to maximize power delivered to the antenna 110 in the free space condition, to the radiation resistor 606 of the PILA antenna equivalent circuit 600 in the talking position. The graph 702 amplitude response is an approximation of the antenna efficiency versus frequency for an antenna in the talking position, while the tuning network 112 is optimized for free space. Because the tuning network 112 is controlled to deliver maximum power into the antenna 110 in free space, while the antenna equivalent circuit 600 is selected to match the antenna performance in the user position, the antenna efficiency is degraded to −10 dB as indicated by curve segment 704 of the band of interest, 1965 to 1980 MHz, shown in bold. Graph 706 shows the amplitude response from the tuning network 112 designed to maximize power delivered to the antenna 110 in the talking position, wherein the user's head and right hand are located in the antenna near field, to the radiation resistor 606 of the PILA antenna equivalent circuit 600 in the talking position. The graph 706 amplitude response is an approximation of the antenna efficiency versus frequency of the antenna in talking position while the tuning network is optimized for the talking position. Because the tuning network 112 is controlled to deliver maximum power into the antenna 110 in the talking position and the antenna equivalent circuit 600 is selected to match the antenna performance in the talking position, the antenna efficiency is improved to −4 dB, as indicated by curve segment 708 of the band of interest, 1965 to 1980 MHz, shown in bold. Thus, changing the tuning network 112 from a free space optimized design to a user position optimized design causes the antenna efficiency to change from −10 dB to −4 dB, for a 6 dB improvement.

Simulation data 700 is used to determine the change in insertion phase that occurs when changing the tuning circuit 112 from a first state to a second state. The phase shift network 114 can be designed to cancel this change in insertion phase. Graphs 710 and 714 approximate antenna efficiency in polar form, from which we can determine the insertion phase of the tuning network 112 and the antenna 110. Graph 710 shows the polar form response from tuning network 112 designed to maximize power delivered to the radiation resistor 606 of the PILA antenna equivalent circuit 600 in the talking position. The graph 710 shows the insertion phase is approximately 150 degrees, as indicated by curve segment 712 of the band of interest, 1965 to 1980 MHz, shown in bold. Graph 716 shows the polar response from tuning network 112 designed to maximize power delivered to the radiation resistor 606 of the PILA antenna equivalent circuit 600 (FIG. 6) in the talking position. The graph 716 shows the insertion phase is approximately 80 degrees, as indicated by curve segment 718 of the band of interest, 1965 to 1980 MHz, shown in bold. By taking the difference from graphs 710 and 716, it can be determined that the change in insertion phase is −70 degrees. Thus, a change of approximately 70 degrees in the phase shift network 114 cancels the change in insertion phase of the tuning network 112 and the antenna 110.

Figure 8:
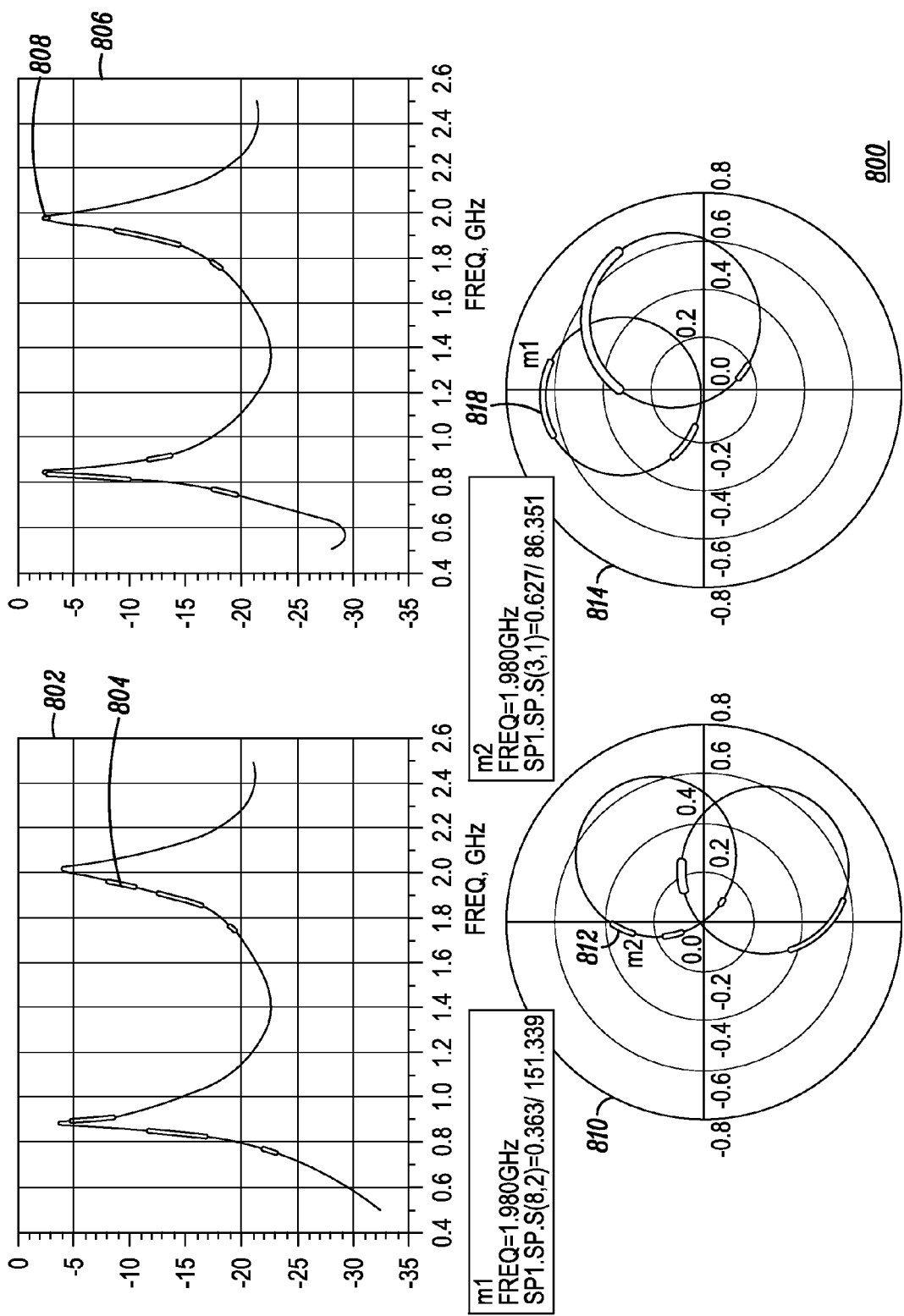
FIG. 8 shows simulation data that includes plots of the transfer function of the phase shift network and the tuning network driving the equivalent circuit of FIG. 6.

Referring to FIG. 8, simulation data 800 is shown that includes plots of transfer functions of the phase shift network 114 and the tuning network 112 driving the antenna equivalent circuit 600. The conditions and parameters used to create simulation data 800 are the same as those used to create simulation data 700, except a phase shift network 114 was included in series, at the input of the tuning network 112.

Simulation data 800 is used to verify the change in insertion phase of the tuning network 112 driving the antenna equivalent circuit 600 is cancelled by an opposite phase change of the phase shift network 114. Graph 802 shows the amplitude response from tuning network 112 designed to maximize power delivered to the antenna 110 in the free space condition, to the radiation resistor 606 of the PILA antenna equivalent circuit 600 in the talking position. The graph 802 amplitude response is an approximation of the antenna efficiency versus frequency for an antenna in the talking position, while the tuning network 112 is optimized for free space. Because the tuning network 112 is controlled to deliver maximum power into the antenna in free space, while the antenna equivalent circuit is selected to match the antenna performance in the user position, the antenna efficiency is degraded to −10 dB as indicated by curve segment 804 of the band of interest, 1965 to 1980 MHz, shown in bold. Graph 806 shows the amplitude response from the tuning network 112 designed to maximize power delivered to the antenna 110 in the talking position, wherein the user's head and right hand are located in the antenna near field, to the radiation resistor 606 of the PILA antenna equivalent circuit 600 in the talking position. The graph 806 amplitude response is an approximation of the antenna efficiency versus frequency of the antenna 110 in talking position while the tuning network 112 is optimized for the talking position. Because the tuning network is controlled to deliver maximum power into the antenna in talking position and the antenna equivalent circuit is selected to match the antenna performance in the talking position, the antenna efficiency is improved to −4 dB, as indicated by curve segment 808 of the band of interest, 1965 to 1980 MHz, shown in bold. Thus, changing the tuning network from a free space optimized design to a user position optimized design causes the antenna efficiency to change from −10 dB to −4 dB, for a 6 dB improvement.

The simulation data 800 of FIG. 8 is used to verify that the change in insertion phase that occurs when changing the tuning circuit 112 from a first state to a second state is cancelled by the tuning network 114. Graphs 810 and 814 approximate antenna efficiency in polar form, from which we can determine the insertion phase of the tuning network 112 and the antenna 110. Graph 810 shows the polar form response from tuning network 112 designed to maximize power delivered to the radiation resistor 606 of the PILA antenna equivalent circuit 600 in the talking position. The graph 810 shows the insertion phase is approximately 90 degrees, as indicated by curve segment 812 of the band of interest, 1965 to 1980 MHz, shown in bold. Graph 814 shows the polar response from the tuning network 112 designed to maximize power to the radiation resistor 606 of the PILA antenna equivalent circuit 600 in the talking position. The graph 814 shows the insertion phase is approximately 90 degrees, as indicated by curve segment 818 of the band of interest, 1965 to 1980 MHz, shown in bold. By taking the difference from graphs 810 and 814, the change in insertion phase can be seen to be approximately zero. Thus, the change of +70 degrees required in data set 700 has been achieved in data set 800, by the insertion of the phase shift network 114, demonstrating that the phase shift network 114 can cancel the change in insertion phase of the tuning network 112 and the antenna 110.

Referring back to FIG. 1, the mobile device 102 may include a digital to analog converter (DAC) 127 that is electrically coupled to both the controller 108 and the tuning network 112. If the variable capacitor 138 in tuning network 112 is made up of components that are switched in and out of circuit to adjust the desired response, such as a C2C network, then the DAC 127 is not required and a digital signal can be used control the tuning network 112. A C2C network is a network that has several elements including a capacitor of value C, a capacitor of value 2*C, a capacitor with value 4*C, and may include additional components. By switching in or out the different capacitors a wide variety of capacitance values may be achieved in the tuning network. If the tuning network 112 is composed of varactors, varactor-like elements, or other continuously tuning elements, then the DAC 127 will be used to convert the digital control signal in an analog control voltage.

To adjust the phase shift carried out by the phase shift network 114 and to adjust the impedance of the tuning network 112 according to an embodiment of the invention, the controller 108 receives modem state data from the transceiver module 106; band, sub-band or channel data from the transceiver module 106; and application state data from the application processor 109. The controller 108 then uses the received data to reference a look-up table. The look-up table contains numerical values that indicate to the controller 108 what signals to send to the phase shift network 114 and to the tuning network 112. The lookup table and the values contained therein may be stored in a memory of the controller 108.

Figures 9, 9A:
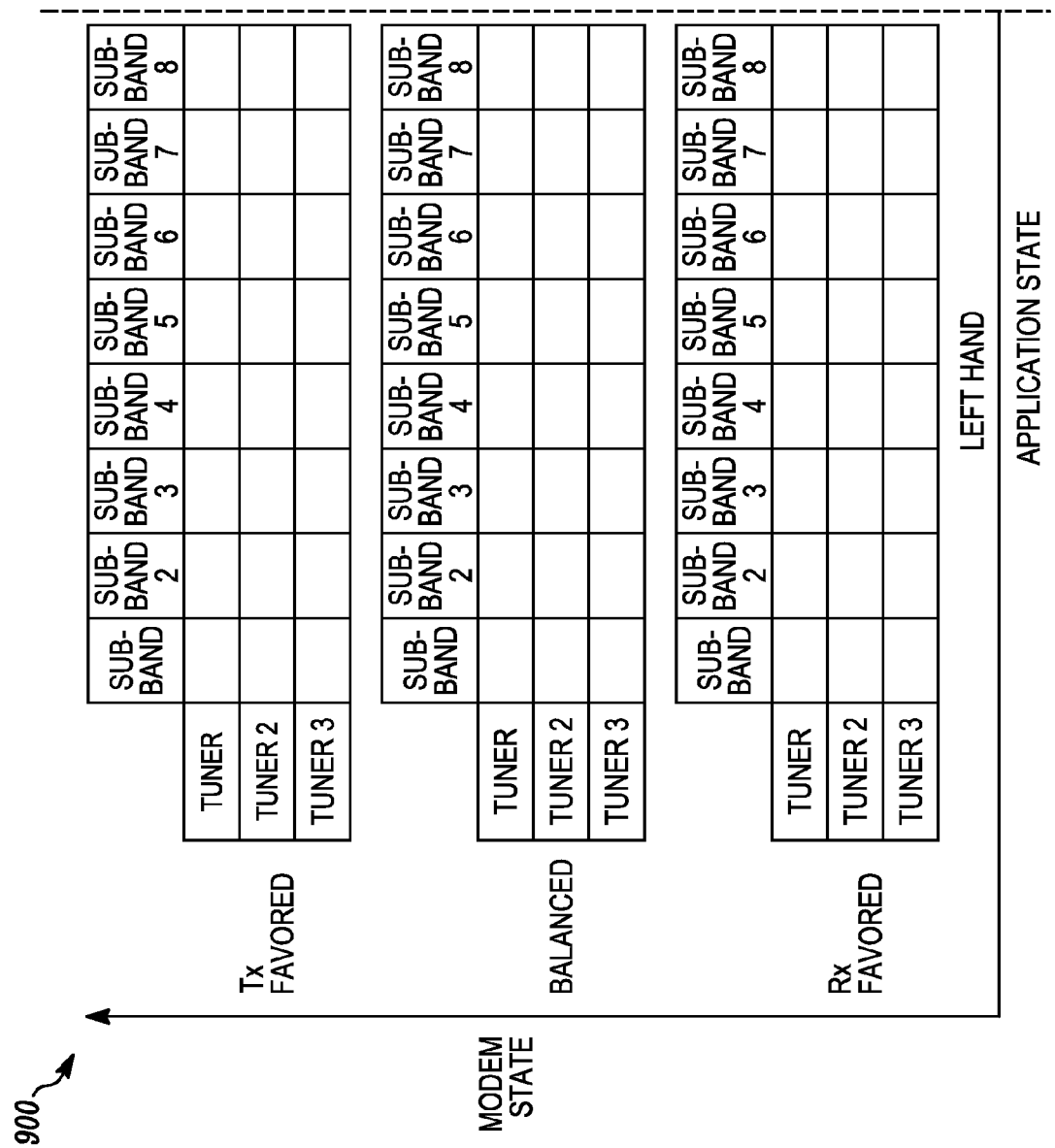
FIGS. 9A and 9B show an example of the structure of a lookup table in accordance with an embodiment of the invention.
Figure 9B:
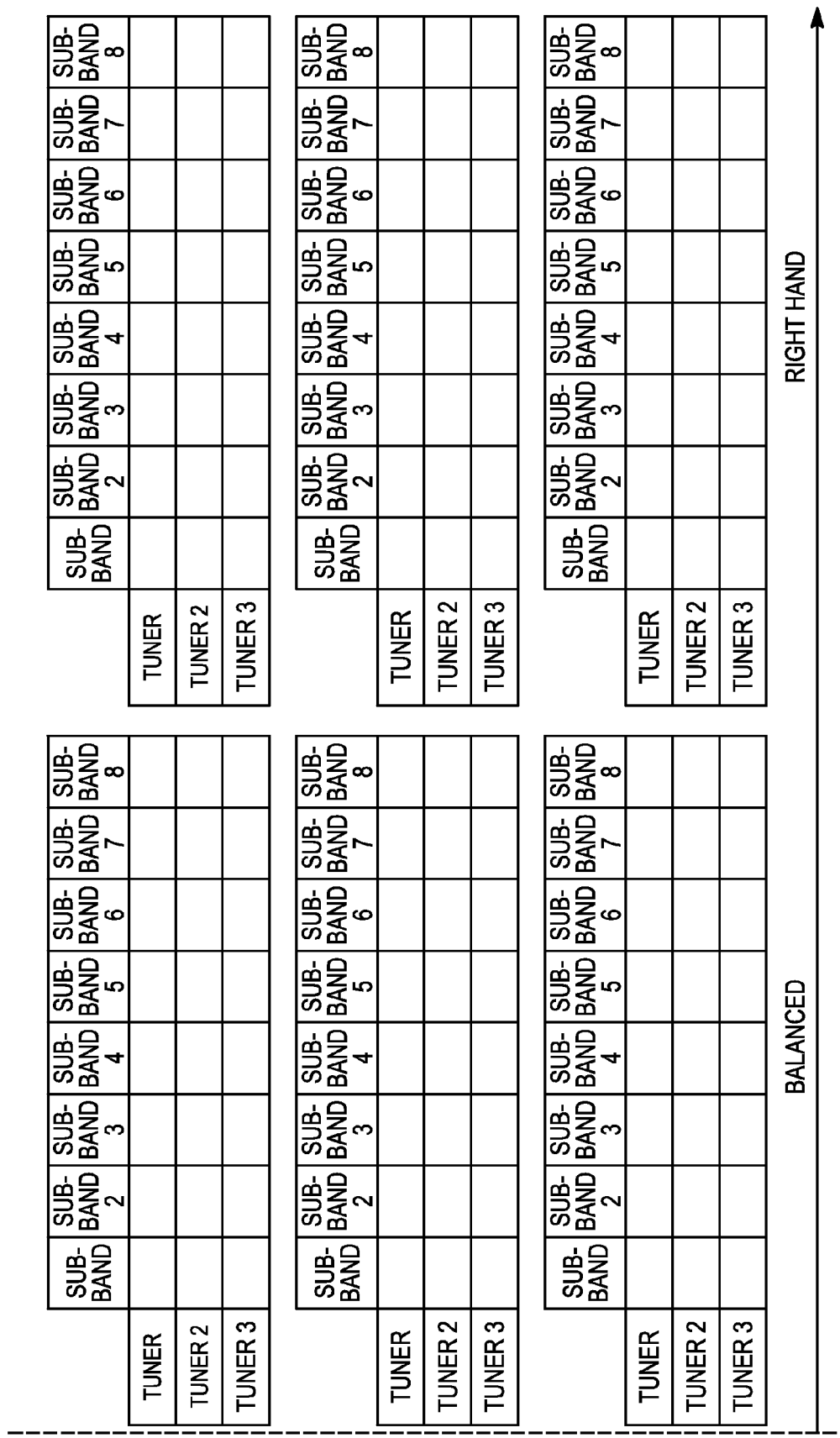

Referring to FIGS. 9A and 9B, an example of a lookup table in accordance with an embodiment of the invention will now be described. The lookup table, generally labeled 900, may have three or more dimensions (frequency, sub-band, and the state of the tuning network 112 and the phase shift network 114), but is shown as a series of two-dimensional tables for the sake of clarity. The lookup table 900 associates the sub-band on which the mobile device 102 (FIG. 1) operates, according to one of three modem states: Rx Favored, Balanced, or Tx Favored. If the Tx modem 120 (FIG. 2) is more challenged than the Rx modem 122 (e.g. the Tx modem 120 is transmitting at maximum power but the Rx modem is below maximum power), then the modems will be in a Tx Favored mode, such that the tuning network 112 and the phase shift network 114 will need to be put into a state that minimizes the loss on the transmit frequency. If the Rx modem 122 is more challenged than the Tx modem 120 (e.g. the Rx modem 120 is experiencing bit and/or frame errors as a result of it being set at a level that is too sensitive), then the modems will be in an Rx Favored mode, such that the tuning network 112 and the phase shift network 114 will need to be put into a state that minimizes the loss on the receive frequency. If the Tx modem 120 and the Rx modem 122 are equally challenged then the modems are in a Balanced state.

The lookup table 900 also associates the tuner and sub-band of the mobile device 102 with one of three application states: Left Hand Talking Position, Balanced and Right Hand Talking Position. The mobile device 102 is said to be in a Left Hand Talking Position state when the user is holding the mobile device 102 to his head with his left hand, and in the Right Hand Talking Position state when the user is holding it to his head with his right hand. A balanced state is when the mobile device 102 is not next the user's head, but is, for example, resting on a table. The sensor 111 (FIG. 1) detects (using, for example, proximity sensing electronics) the application state and provides this information to the application processor 109 which, in turn, provides the information to the controller 108.

Other states are possible in the lookup table. For instances, the Rx may be challenged while the Tx is enjoying very low link loss. In this mode, the antenna tuner would be adjusted to improve the Rx signal, possibly even at the expense of the transmit signal. Since the Tx signal is enjoying low loss, the transmit modulation could be set to a higher order such as 64 QAM. In this state, the base station receiver will have heightened sensitivity to phase shifts of the Tx signal. The phase shift network could be operated to compensate for phase shifts of the Tx signal, while the antenna tuner is operated to improve the quality of the Rx signal.

Figure 10:
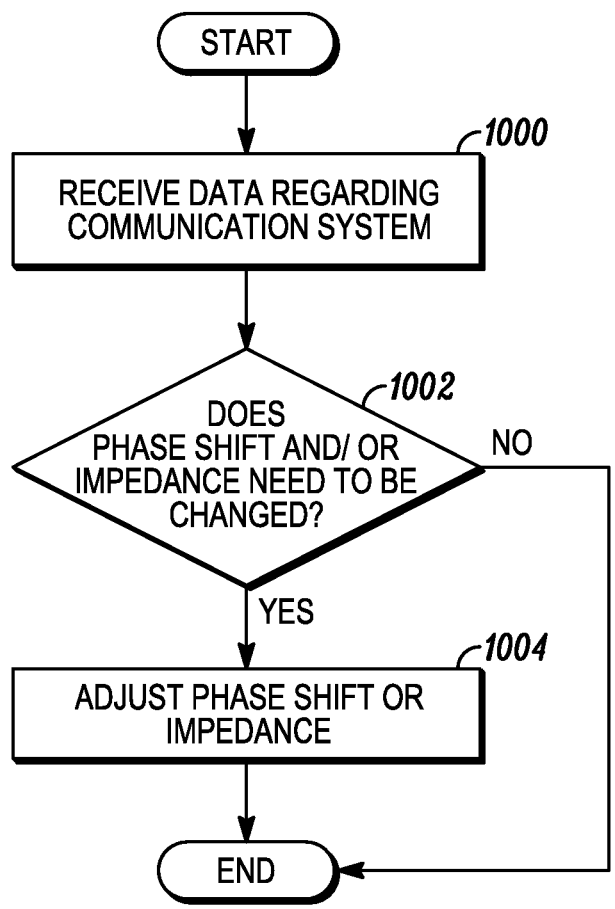
FIG. 10 shows steps that are carried out to compensate for phase shift according to an embodiment of the invention.

Referring to FIG. 10, an example of a procedure that is followed to compensate for phase shift according to an embodiment of the invention will now be described. At step 1000, the controller 108 (FIG. 1) receives data regarding the state of the communication system 10 (FIG. 1). This data may include data regarding the band, sub-band, or channel of on which the mobile device 102 is communicating, data regarding the state of the Tx modem 120 and the Rx modem 122 (FIG. 2), and data regarding the application state (e.g. the application being executed by the application processor 109). At step 1002, the controller 108 determines whether the impedance of the tuning network 112 and the phase shift carried out by the phase shift network 114, respectively, need to be changed. For example: The controller may determine that the user has switched the phone from the left side of the head to the right side of the head. The device is transmitting on the lowest channel in the 800 MHz band (3GPP band 5). The Transmit and Received signals are balanced (both are of good quality). Upon detecting the change from the left side to the right side the controller would consult the table 500 (FIG. 5) and recover the tuner setting for the sub band including 800 MHz lowest channel for the right side of the head, with balanced Rx and Tx. The controller would recall the present antenna tuner setting and calculate the phase change from the present setting to the new setting which for example may be 30 degrees. The controller then calculates a setting for the phase shift network that would result in a −30 degree phase shift. The new antenna tuner settings and phase shift settings are applied to the circuits. The result is improved link quality with minimal phase corruption to the signal. If the impedance and/or the phase shift needs to be changed, then the controller 108 makes the appropriate change at step 1004. If not, then the process ends.

Although a single phase shift network has been referred to herein, multiple phase shift networks may be used. For example, two phase shift networks may be employed, where the first phase shift network is placed in the transmitter branch affecting the transmission signal but having minimal or no impact on the receive signal. The second phase shift network may be placed in the receiver branch affecting the phase of the receive signal but having minimal or no impact on the transmit signal. By this method both the transmission and receive signals may be compensated for phase changes such as changes from gripping the phone differently, or changes from operation of the antenna tuning network. Devices with multiple transmitters or receivers may have multiple phase shift networks.

Although described specifically throughout the entirety of the instant disclosure, representative examples have utility over a wide range of applications, and the above discussion is not intended and should not be construed to be limiting. The terms, descriptions and figures used herein are set forth by way of illustration only and are not meant as limitations. Those skilled in the art recognize that many variations are possible within the spirit and scope of the examples. While the examples have been described with reference to examples, those skilled in the art are able to make various modifications to the described examples without departing from the scope of the examples as described in the following claims, and their equivalents.

What is claimed is:

1. A communication device comprising:
an antenna;
a tuning network electrically coupled to the antenna;
a phase shift network electrically coupled to the tuning network; and
a controller communicatively linked to the tuning network and to the phase shift network, wherein the controller is configured to:
receive data regarding a state of a communication system in which the communication device operates,
adjust, at a first time, an impedance of the tuning network based on the data,
adjust, at a second time, a phase shift carried out by the phase shift network based on the data, wherein a difference between the first time and the second time is related to a propagation delay through at least one of the tuning network and the phase shift network.

2. The communication device of claim 1, wherein the data comprises data regarding at least one of a band or sub-band on which the communication device is communicating.

3. The communication device of claim 1, wherein the phase shift network is operated to reduce a phase shift resulting from a change in operation of the tuning network.

4. The communication device of claim 1, further comprising:
a processor, wherein the data comprises data regarding an application being executed by the processor.

5. The communication device of claim 1,
wherein the controller stores values that associate states of the communication system with settings of the tuning network and adjusts the impedance of the tuning network based on the stored values.

6. The communication device of claim 5, wherein the controller changes the impedance of the tuning network by changing a state of a bank of capacitors of the tuning network.

7. The communication device of claim 5, wherein the controller changes the impedance of the tuning network by changing a state of a varactor of the tuning network.

8. The communication device of claim 1, further comprising:
a modem that modulates or demodulates signals that travel through the antenna, wherein the data comprises data regarding a state of the modem.

9. The communication device of claim 1, further comprising:
a transmission modem that modulates signals that are to be transmitted from the communication device via the antenna;
a receiver modem that demodulates signals that are received by the communication device via the antenna; and
an application processor that detects an application for which the communication device is being used,
wherein the data comprises data regarding a state of the transmission modem, a state of the receiver modem, the application for which the communication device is being used, and the band, sub-band or channel on which the communication device is communicating.

10. The communication device of claim 1,
wherein the controller changes the impedance of the tuning network to optimize a characteristic related to the antenna, thereby resulting in a phase change, and
wherein the controller changes the phase shift of the phase shift network to minimize a phase change resulting from the change in the impedance of the tuning network.

11. A method for compensating for phase shift on a communication device, the method comprising:
determining an application state of the communication device;
adjusting, at a first time, a phase of a radio frequency signal carried on a phase shift network received by the communication device based on the application state of the communication device; and
adjusting, at a second time, an impedance of a load electrically coupled to an antenna based on the application state of the communication device, wherein a difference between the first time and the second time is related to a propagation delay through at least one of the phase shift network and the load.

12. The method of claim 11, wherein determining the application state of the communication device comprises determining an application for which the communication device is being used.

13. The method of claim 11, wherein determining the application state of the communication device comprises determining whether a processor of the communication device is executing a voice application or a data application.

14. The method of claim 11, wherein determining the application state of the communication device comprises determining how the communication device is being held by a user.

15. The method of claim 11, further comprising:
determining a state of a modem of the communication device,
wherein adjusting the phase of the radio frequency signal and the impedance of the load are performed based on the determined application state and the determined state of the modem.

16. The method of claim 11, further comprising:
determining a band, sub-band, or channel on which the communication device is communicating,
wherein adjusting the phase of the radio frequency signal and the impedance of the load are performed based on the determined application state and the determined band, sub-band, or channel.

17. A method for compensating for phase shift in a communication device, the method comprising:
receiving data regarding a band, sub-band, or channel over which the communication device is communicating;
receiving data regarding a state of a modem being used by the communication device to transmit or receive over a medium, wherein the data regarding the state of the modem being used by the communication device comprises data regarding whether a transmit modem or a receive modem is being favored;

receiving data regarding an application for which the communication device is being used, wherein the data regarding the application for which the communication device is being used comprises data regarding how the communication device is being held by a user;

adjusting an impedance of a matching network coupled to an antenna being used by the communication device to transmit or receive over the medium based on the data regarding the band, sub-band, or channel; and adjusting a phase shift of a phase shift network coupled to the matching network based on the data regarding the band, sub-band, or channel.

18. The method of claim 17 further comprising:

referencing a lookup table that associates the band, sub-band, or channel, the state of the modem, and the application with values usable to perform adjusting the impedance of the matching network and adjusting the phase shift of the phase shift network.

* * * * *